US007800638B2

(12) United States Patent
Ogawa

(10) Patent No.: US 7,800,638 B2
(45) Date of Patent: Sep. 21, 2010

(54) PLATEMAKING APPARATUS

(75) Inventor: Hideaki Ogawa, Kyoto (JP)

(73) Assignee: Dainippon Screen Mfg. Co., Ltd., Kyoto (JP)

(*) Notice: Subject to any disclaimer, the term of this patent is extended or adjusted under 35 U.S.C. 154(b) by 1212 days.

(21) Appl. No.: 11/370,019

(22) Filed: Mar. 8, 2006

(65) Prior Publication Data

US 2006/0203861 A1 Sep. 14, 2006

(30) Foreign Application Priority Data

Mar. 8, 2005 (JP) ............................ 2005-063414

(51) Int. Cl.
*B41J 2/435* (2006.01)
*G03F 7/00* (2006.01)
*G03C 8/00* (2006.01)

(52) U.S. Cl. ........................ 347/224; 430/300; 430/204

(58) Field of Classification Search ................. 347/224; 430/300, 204

See application file for complete search history.

(56) References Cited

U.S. PATENT DOCUMENTS

| | | | | |
|---|---|---|---|---|
| 4,064,205 | A * | 12/1977 | Landsman | 430/200 |
| 5,327,167 | A | 7/1994 | Pollard et al. | |
| 5,427,026 | A | 6/1995 | Kuwahara | |
| 5,557,303 | A | 9/1996 | Agano et al. | |
| 6,150,629 | A | 11/2000 | Sievers | |
| 6,857,365 | B2 | 2/2005 | Juffinger et al. | |
| 2003/0218667 | A1 | 11/2003 | Williams et al. | |
| 2003/0221570 | A1 | 12/2003 | Campbell et al. | |

FOREIGN PATENT DOCUMENTS

| | | |
|---|---|---|
| DE | 43 13 111 A1 | 10/1994 |
| DE | 101 16 672 A1 | 10/2001 |
| JP | 2002-148814 | 5/2002 |
| JP | 2003-053928 | 2/2003 |
| JP | 3556204 | 8/2004 |
| JP | 2004-286175 | 10/2004 |
| WO | WO 97/19783 | 6/1997 |

OTHER PUBLICATIONS

European Search Report issued in European Patent Application No. EP 06003518.5-1251, mailed Nov. 25, 2008.
Japanese Office Action issued in Japanese Patent Application No. JP 2005-063414 dated Jul. 6, 2010.

* cited by examiner

*Primary Examiner*—Julian D Huffman
*Assistant Examiner*—Sarah Al-Hashimi
(74) *Attorney, Agent, or Firm*—McDermott Will & Emery LLP

(57) ABSTRACT

A laser engraving machine has a recording drum 11 rotatable with a flexo sensitive material 10 mounted peripherally thereof, and a recording head 20 movable parallel to the axis of this recording drum 11. The recording head 20 includes a first laser source 21 for emitting a precision engraving beam L1, a second laser source 24 for emitting a coarse engraving beam L2, an AOM 22 for modulating the precision engraving beam L1, an AOD 23 for causing the precision engraving beam L1 to scan axially of the recording drum 11, an AOM 25 for modulating the coarse engraving beam L2, a synthesizing device 27, and an optic 26 for condensing the precision engraving beam L1 and coarse engraving beam L2 synthesized by the synthesizing device 27 on the flexo sensitive material 10.

7 Claims, 13 Drawing Sheets

PLATEMAKING APPARATUS

BACKGROUND OF THE INVENTION

1. Field of the Invention

This invention relates to a platemaking apparatus for making printing plates for use in letterpress printing such as flexography, and in intaglio printing such as photogravure.

2. Description of the Related Art

Conventional platemaking apparatus of the type noted above include a laser engraving machine as described in U.S. Pat. No. 5,327,167, for example. This laser engraving machine makes letterpress printing plates by scanning a recording material with a laser beam emitted from a laser source to engrave the surface of the recording material. The machine includes a modulator for modulating the laser beam emitted from the laser source, a recording drum rotatable with the recording material mounted peripherally thereof, and a recording head movable in a direction parallel to the axis of the recording drum for irradiating the recording material mounted peripherally of the recording drum with the laser beam emitted from the laser source.

In such a platemaking apparatus for making printing plates, the main scanning speed of the laser beam, i.e. the rotating speed of the recording drum, is set to a value for obtaining a required maximum engraving depth, based on the power of the laser source and the sensitivity of the recording material. Areas shallower than the maximum engraving depth are engraved by reducing the power of the laser beam emitted to the recording material. A relatively large amount of energy is required for engraving the recording material with a laser beam. Thus, there is a drawback of consuming a relatively long time in the platemaking process.

Japanese Patent No. 3556204 discloses a printing block manufacturing method for creating relief by emitting a plurality of laser beams simultaneously to a recording material.

Further, Applicant herein has proposed a platemaking apparatus for engraving a recording material by irradiating the recording material at a first pixel pitch with a laser beam having a first beam diameter, and thereafter irradiating the recording material at a second pixel pitch different from the first pixel pitch with a laser beam having a second beam diameter different from the first beam diameter (Japanese Patent Applications Nos. 2004-286175 and 2004-357586). With this platemaking apparatus, the platemaking time may be shortened by using the laser beams efficiently.

The printing block manufacturing method described in Japanese Patent No. 3556204 noted above can create relief efficiently by emitting a plurality of laser beams simultaneously to a recording material. However, it is difficult to obtain precise engraving results since the laser beams are moved at a fixed pixel pitch. On the other hand, where a recording material is engraved by irradiating the recording material at a first pixel pitch with a laser beam having a first beam diameter, and thereafter irradiating the recording material at a second pixel pitch different from the first pixel pitch with a laser beam having a second beam diameter different from the first beam diameter, a precise engraving may be carried out efficiently, but the engraving requires two steps for its completion. Thus, an engraving process of enhanced efficiency is desired.

SUMMARY OF THE INVENTION

The object of this invention, therefore, is to provide a platemaking apparatus for engraving a precise image at high speed.

The above object is fulfilled, according to this invention, by a platemaking apparatus for making a printing plate, comprising a recording drum rotatable with a recording material mounted peripherally thereof; a first emitting device for emitting a first laser beam to irradiate the recording material at a first pixel pitch, the first beam having a first beam diameter on the recording material, thereby to engrave the recording material to a first depth; a second emitting device for emitting a second laser beam to irradiate the recording material at a second pixel pitch larger than the first pixel pitch, the second beam having a second beam diameter larger than the first beam diameter on the recording material, thereby to engrave the recording material to a second depth larger than the first depth; a first scanning device for causing the first laser beam emitted from the first emitting device and the second laser beam emitted from the second emitting device to scan synchronously and axially of the recording drum; and a second scanning device for causing the first laser beam emitted from the first emitting device to scan the recording material at the second pixel pitch axially of the recording drum.

This platemaking apparatus can engrave a precise image at high speed.

In a preferred embodiment, the platemaking apparatus satisfies the following equation:

$$F1=F2\cdot(pc/pp),$$

Where F1 is a scanning frequency of the first laser beam axially of the recording drum, F2 is a modulation frequency of the second modulating device, pp is the first pixel pitch, and pc is the second pixel pitch.

In another aspect of the invention, a platemaking apparatus comprises a recording drum rotatable with a recording material mounted peripherally thereof; a first laser source for emitting a first laser beam to irradiate the recording material at a first pixel pitch, the first beam having a first beam diameter on the recording material, thereby to engrave the recording material to a first depth; a second laser source for emitting a second laser beam to irradiate the recording material at a second pixel pitch larger than the first pixel pitch, the second beam having a second beam diameter larger than the first beam diameter on the recording material, thereby to engrave the recording material to a second depth larger than the first depth; a first modulating device for modulating the first laser beam; a deflector for causing the first laser beam modulated by the first modulating device to scan the recording material at the second pixel pitch axially of the recording drum; a second modulating device for modulating the second laser beam emitted from the second laser source; a synthesizing device for synthesizing the first laser beam deflected by the deflector and the second laser beam modulated by the second modulating device; an optic for condensing the first and second laser beams synthesized by the synthesizing device on the recording material; and a scanning device for causing the first and second laser beams having passed through the optic and condensed on the recording material to scan synchronously and axially of the recording drum.

Other features and advantages of the invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 3A through 3C are explanatory views schematically showing a shape of a flexo sensitive material surface;

DESCRIPTION OF THE PREFERRED EMBODIMENTS

Figure 1:
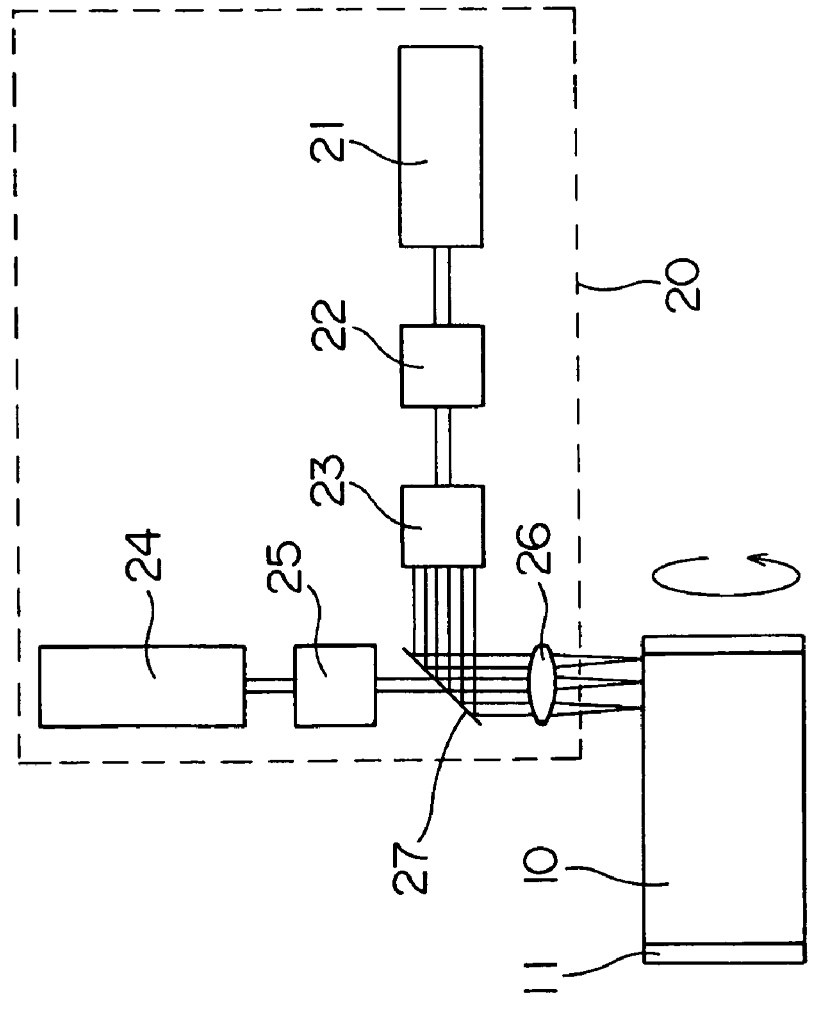
FIG. 1 is a schematic view of a laser engraving machine.
Figure 2:
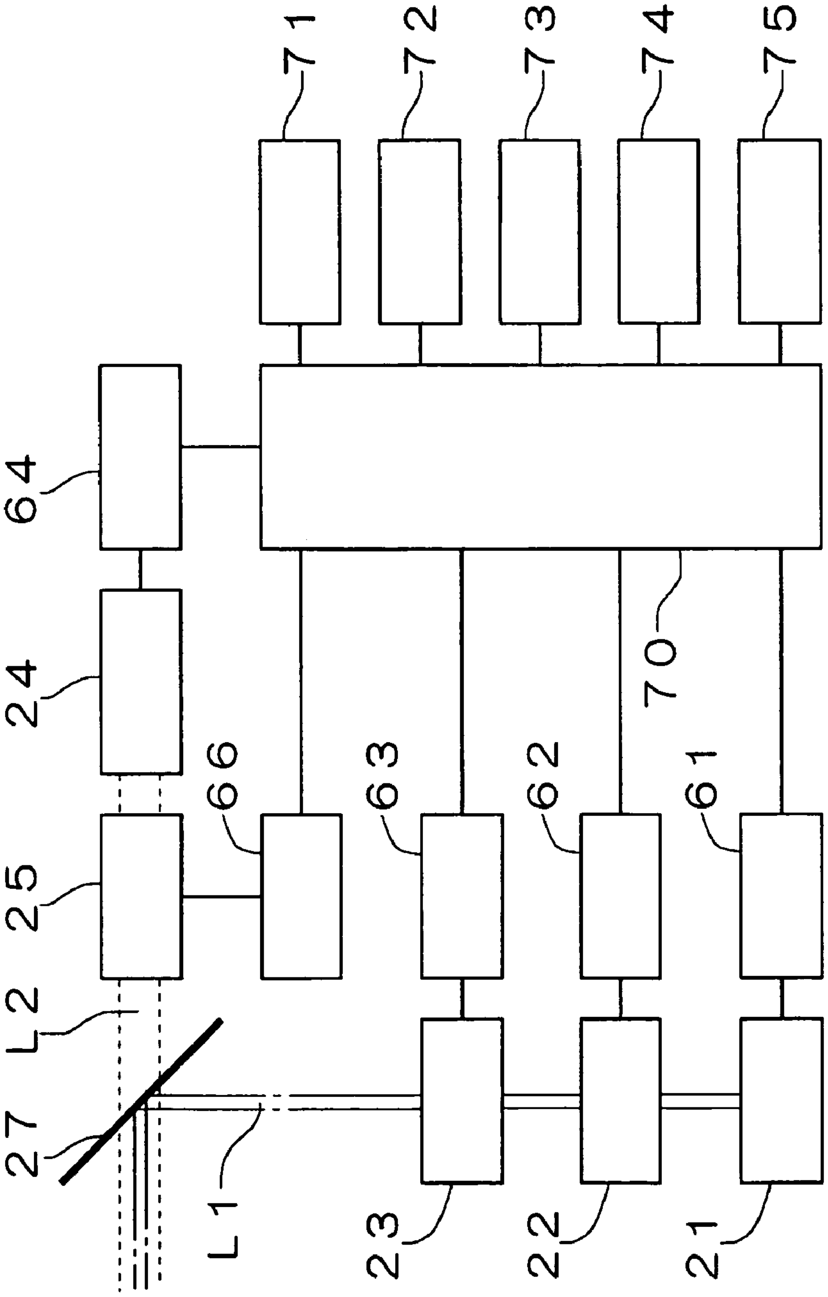
FIG. 2 is a block diagram showing a principal portion of the laser engraving machine.

Embodiments of this invention will be described hereafter with reference to the drawings. FIG. 1 is a view showing an outline of a laser engraving machine which is a platemaking apparatus according to this invention. FIG. 2 is a block diagram showing a principal portion of the apparatus.

The laser engraving machine includes a recording drum 11 for supporting, as mounted peripherally thereof, a flexo direct photosensitive material (hereinafter called "flexo sensitive material") 10 serving as a recording material for a letterpress plate, and a recording head 20 movable in a direction parallel to the axis of the recording drum 11.

The recording head 20 includes a first laser source 21 for emitting a precision engraving beam L1 as a first laser beam, an AOM (acoustooptic modulator) 22 acting as a first modulating device for modulating the precision engraving beam L1, an AOD (acoustooptic deflector) 23 for causing the precision engraving beam L1 modulated by the AOM 22 to scan axially of the recording drum 11, a second laser source 24 for emitting a coarse engraving beam L2 as a second laser beam, an AOM 25 acting as a second modulating device for modulating the coarse engraving beam L2, a beam synthesizer 27 for synthesizing the precision engraving beam L1 and coarse engraving beam L2, and an optic 26 for condensing the precision engraving beam L1 and coarse engraving beam L2 synthesized by the beam synthesizer 27 on the flexo sensitive material 10. The AOM 22 and AOD 23 may be integrated into a single device.

The recording head 20 is guided by a guide device, not shown, to move relative to the recording drum 11 in the direction parallel to the axis of the recording drum 11. The recording head 20 is driven by a ball screw, not shown, rotatable by a moving motor, not shown, to reciprocate in the direction parallel to the axis of the recording drum 11. The moving motor is rotatable on a rotating speed command from a controller 70. A moving speed and positions of the recording head 20 moved by the moving motor are measured by an encoder, not shown, connected to the moving motor and transmitting resulting information to the controller 70.

The first laser source 21 employed in this embodiment emits a beam having an optimal beam diameter as the precision engraving beam L1. The second laser source 24 emits a beam having an optimal beam diameter as the coarse engraving beam L2. However, beam expanders may be used to change the diameters of the laser beams emitted from the first and second laser sources to have optimal values.

The beam synthesizer 27 may be in the form of a dichroic mirror using a difference in wavelength between the first laser source 21 and second laser light source 24, or a polarization beam splitter using a difference in polarization direction between the first laser source 21 and second laser source 24. Where the laser beam output leaves a margin, a half mirror or the like may be used as the beam synthesizer 27.

As shown in FIG. 2, the laser engraving machine includes the controller 70 for controlling the entire machine. The controller 70 is connected to a personal computer 71 acting as an input/output unit and a display unit.

The recording drum 11 shown in FIG. 1 is connected to a rotary motor 72 shown in FIG. 2, to be rotatable about the axis thereof. The rotary motor 72 is rotatable on a rotating speed command from the controller 70. A rotating speed of the rotary motor 72 and angular positions of the recording drum 11 rotated by the rotary motor 72 are measured by an encoder 73 which transmits resulting information to the controller 70.

The recording head 20 shown in FIG. 1 is guided by a guide device, not shown, to move relative to the recording drum 11 in the direction parallel to the axis of the recording drum 11. The recording head 20 is driven by a ball screw, not shown, rotatable by a moving motor 74 shown in FIG. 2, to reciprocate in the direction parallel to the axis of the recording drum 11. The moving motor 74 is rotatable on a rotating speed command from the controller 70. A rotating speed of the moving motor 74 and positions of the recording head 20 moved by the moving motor 74 are measured by an encoder 75 which transmits resulting information to the controller 70.

The first laser source 21 is connected to the controller 70 through a laser driver circuit 61. The AOM 22 is connected to the controller 70 through an AOM driver 62. The AOD 23 is connected to the controller 70 through an AOD driver circuit 63. Similarly, the second laser source 24 is connected to the controller 70 through a laser driver circuit 64. The AOM 25 is connected to the controller 70 through an AOM driver 66.

In this laser engraving machine, the precision engraving beam L1 emitted from the first laser source 21 is modulated by the AOM 22, deflected by the AOD 23 to scan axially of the recording drum 11, and then enters the beam synthesizer 27. On the other hand, the coarse engraving beam L2 emitted from the second laser source 24 enters the beam synthesizer 27 after being modulated by the AOM 25. The precision engraving beam L1 and coarse engraving beam L2 are synthesized by the beam synthesizer 27, and then condense on the flexo sensitive material 10 through the optic 26.

The moving motor 74 moves the recording head 20 in the direction parallel to the axis of the recording drum 11. This causes the precision engraving beam L1 and coarse engraving beam L2 having passed through the optic 26 and condensed on the flexo sensitive material 10 to scan synchronously and axially of the recording drum 11, thereby to engrave a printing plate.

At this time, this laser engraving machine performs a precision engraving process for engraving the flexo sensitive material 10 to a maximum depth dp by irradiating it at a precision engraving pixel pitch pp with the precision engraving beam L1 having a small diameter. Simultaneously, the engraving machine performs a coarse engraving process for engraving the flexo sensitive material 10 to a relief depth d by irradiating it at a coarse engraving pixel pitch pc larger than the precision engraving pixel pitch pp (and equal to a dot pitch) with the coarse engraving beam L2 having a large diameter. The engraving machine shortens the platemaking time by performing the above two processes simultaneously.

The first laser source 21 may be in the form of a YAG laser or fiber laser which emits near-infrared light. Where such a laser source is used as the first laser source 21, the laser beam has a wavelength of about 1 μm. This enables a very small final spot diameter of the laser beam in time of engraving. Great energy is not required for precision engraving that engraves to the maximum depth dp. The first laser source 21 need not have high power, and can therefore be inexpensive.

The second laser source 24 is in the form of a carbon dioxide laser, for example. Such a laser source used as the second laser source 24 provides a high-power laser beam for the relatively low cost of the laser source. A laser beam having a relatively large diameter can be used to perform coarse engraving which engraves to the relief depth d, and thus free from a problem of being incapable of high-resolution engraving.

Figures 3A, 3B:
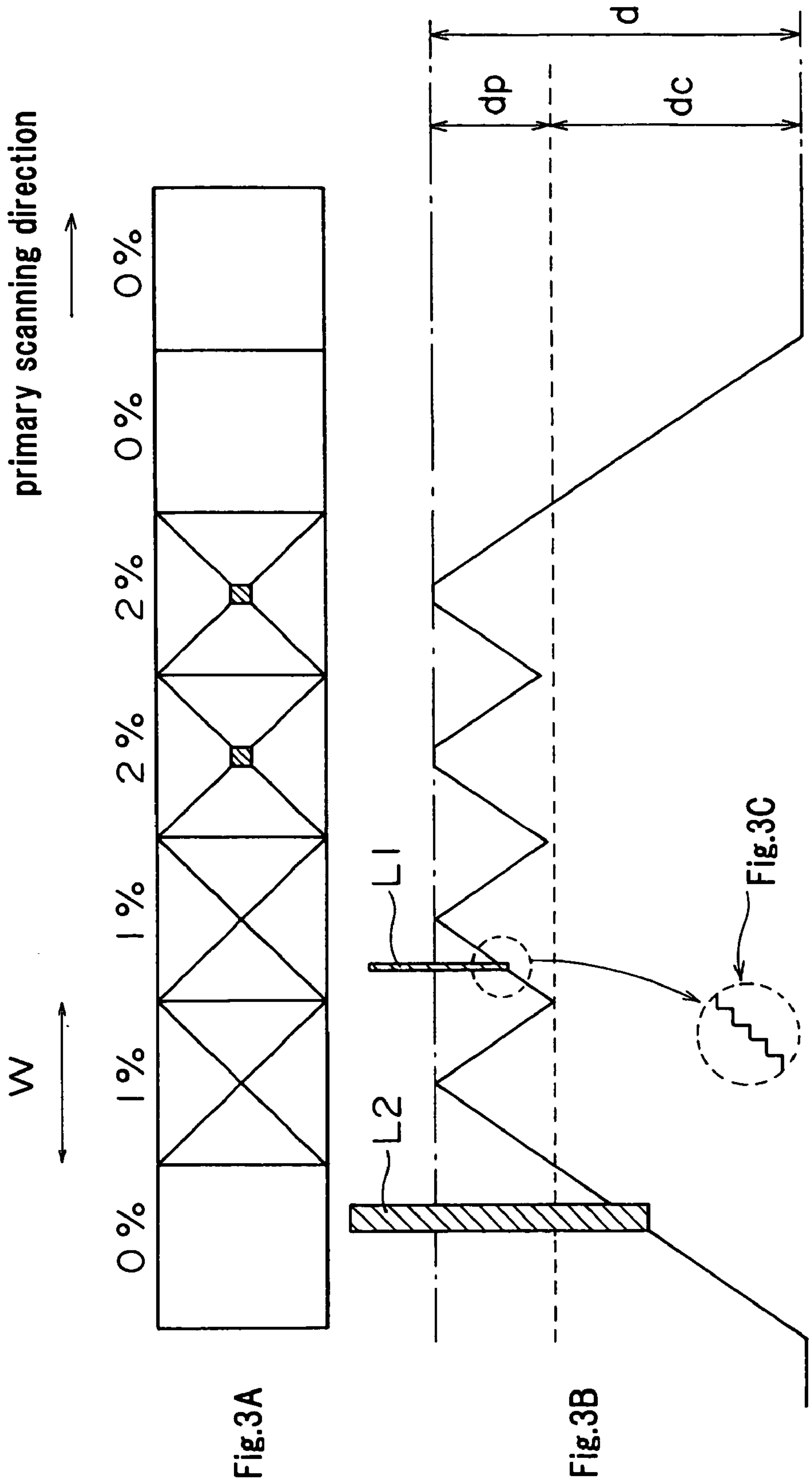

FIGS. 3A, 3B and 3C are explanatory views schematically showing a shape of the surface of the flexo sensitive material 10 engraved by using this laser engraving machine. FIG. 3A is a plan view of seven reliefs formed in a primary scanning direction on the flexo sensitive material 10. FIG. 3B is a sectional view of the reliefs. For facility of description, these figures show seven reliefs having dot percentages at 0%, 1%, 1%, 2%, 2%, 0% and 0% in order from left to right.

As seen, the precision engraving beam L1 having a small diameter is used in the precision engraving. The precision engraving beam L1 irradiates the flexo sensitive material 10 at the precision engraving pixel pitch pp to engrave the flexo sensitive material 10 to the maximum depth dp from the surface.

This maximum depth dp corresponds to an engraving depth at boundaries between adjacent reliefs having a very small dot percentage. When the maximum depth dp is smaller than this, minute halftone dots cannot be expressed well. It is possible to make the maximum depth dp larger than this, but then engraving efficiency will become worse. In this embodiment, where reliefs of dot percentage at 1% adjoin each other, the engraving depth at the boundary therebetween is set to the maximum depth dp.

This precision engraving is carried out to engrave portions of the flexo sensitive material 10 that directly influence the shape of halftone dots, from the surface to the maximum depth dp. For this purpose, the relatively small engraving pixel pitch pp is employed at this time, resulting in a minute gradation as schematically shown in FIG. 3C. A small diameter is employed as the diameter of the precision engraving beam L1 at this time for engraving at the precision engraving pixel pitch pp.

The coarse engraving is performed simultaneously with the precision engraving. The coarse engraving beam L2 having a large diameter is used in the coarse engraving. The coarse engraving beam L2 irradiates the flexo sensitive material 10 at the coarse engraving pixel pitch pc to engrave the flexo sensitive material 10 from the maximum depth dp to the relief depth d. Since the areas engraved in the precision engraving are engraved again in the coarse engraving, the engraving depth d from the surface of flexo sensitive material 10 resulting from the coarse engraving is greater than the engraving depth dp by the precision engraving. This coarse engraving is carried out to engrave portions of the flexo sensitive material 10 that have no direct influence on the shape of halftone dots. It is therefore possible to employ the large coarse engraving pixel pitch pc. This applies also to the case where the precision engraving and coarse engraving are taken in a reversed order.

At this time, a dot pitch w may be employed as the coarse engraving pixel pitch pc. This coarse engraving pixel pitch pc may be set within a range greater than the precision engraving pixel pitch pp noted above and not exceeding the dot pitch w. The closer the pitch pc is to the dot pitch w, the higher becomes engraving efficiency.

Figure 4:
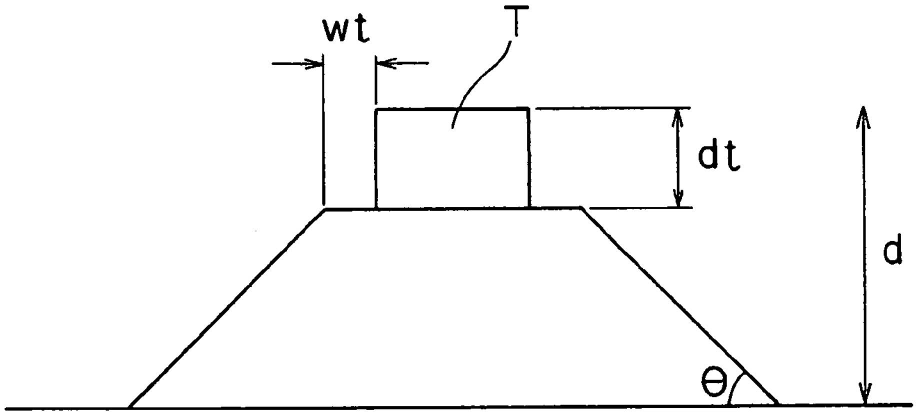
FIG. 4 is an explanatory view of a relief shape.

FIG. 4 is an explanatory view showing, more accurately, the shape of relief formed on the flexo sensitive material 10.

Parameters defining the relief shape include relief angle θ, relief depth d, and step dt and plateau wt for forming top hat T. The relief angle θ has a value common to all reliefs. The relief depth d is an engraving depth for areas of zero dot percent. The step dt is set in order to improve dot gain, and the plateau wt is set in order to increase the mechanical strength of relief. Where the top hat T itself is not formed, the values of step dt and plateau wt become zero. In the foregoing description, step dt and plateau wt are omitted.

Where the relief shape shown in FIG. 4 is employed, the maximum depth dp noted above may be derived from the following equation (1):

$$dp=(2^{1/2}\cdot pc/2-\mathrm{wt})\tan(\theta\pi/180)+dt \quad (1)$$

Where the top hat T itself is not formed, zero may be substituted for step dt and plateau wt.

When the precision engraving and coarse engraving are carried out simultaneously, as described above, it is necessary to perform the precision engraving at the precision engraving pixel pitch pp, and the coarse engraving at the coarse engraving pixel pitch pc. However, where the recording head 20 is moved for causing the precision engraving beam L1 and coarse engraving beam L2 synchronously to scan axially of the recording drum 11, the engraving pixel pitches usually have to be the same for the axial direction of the recording drum 11. The laser engraving machine according to this invention employs a construction for causing the precision engraving beam L1 and coarse engraving beam L2 to scan synchronously in the primary scanning direction (i.e. circumferentially of the recording drum 11), and for causing the precision engraving beam L1 to scan the flexo sensitive material 10 at the coarse engraving pixel pitch pc in the secondary scanning direction (i.e. axially of the recording drum 11).

Figure 5:
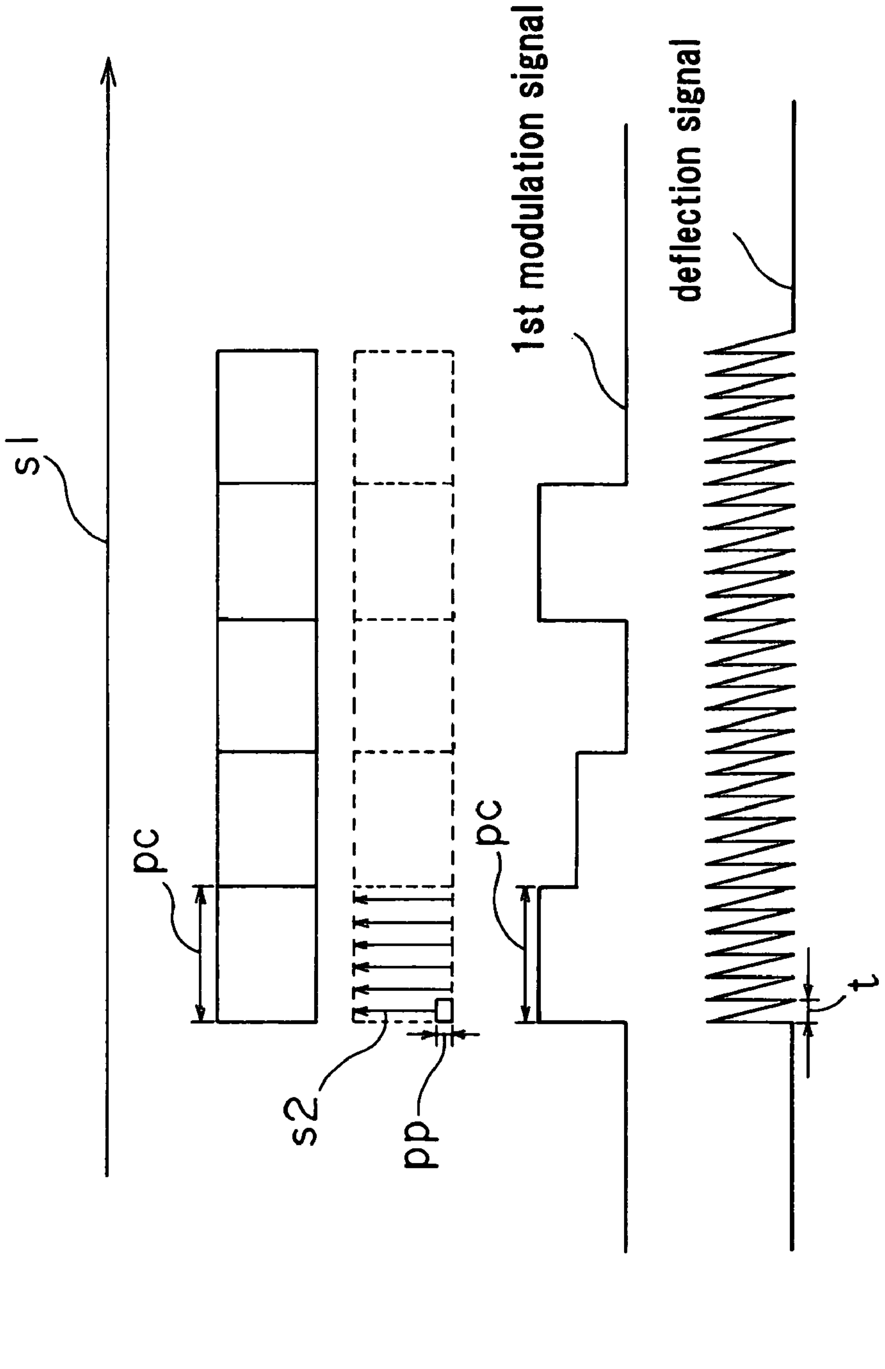
FIG. 5 is an explanatory view showing signals used for causing scanning action of a precision engraving beam and a coarse engraving beam.
Figure 6:
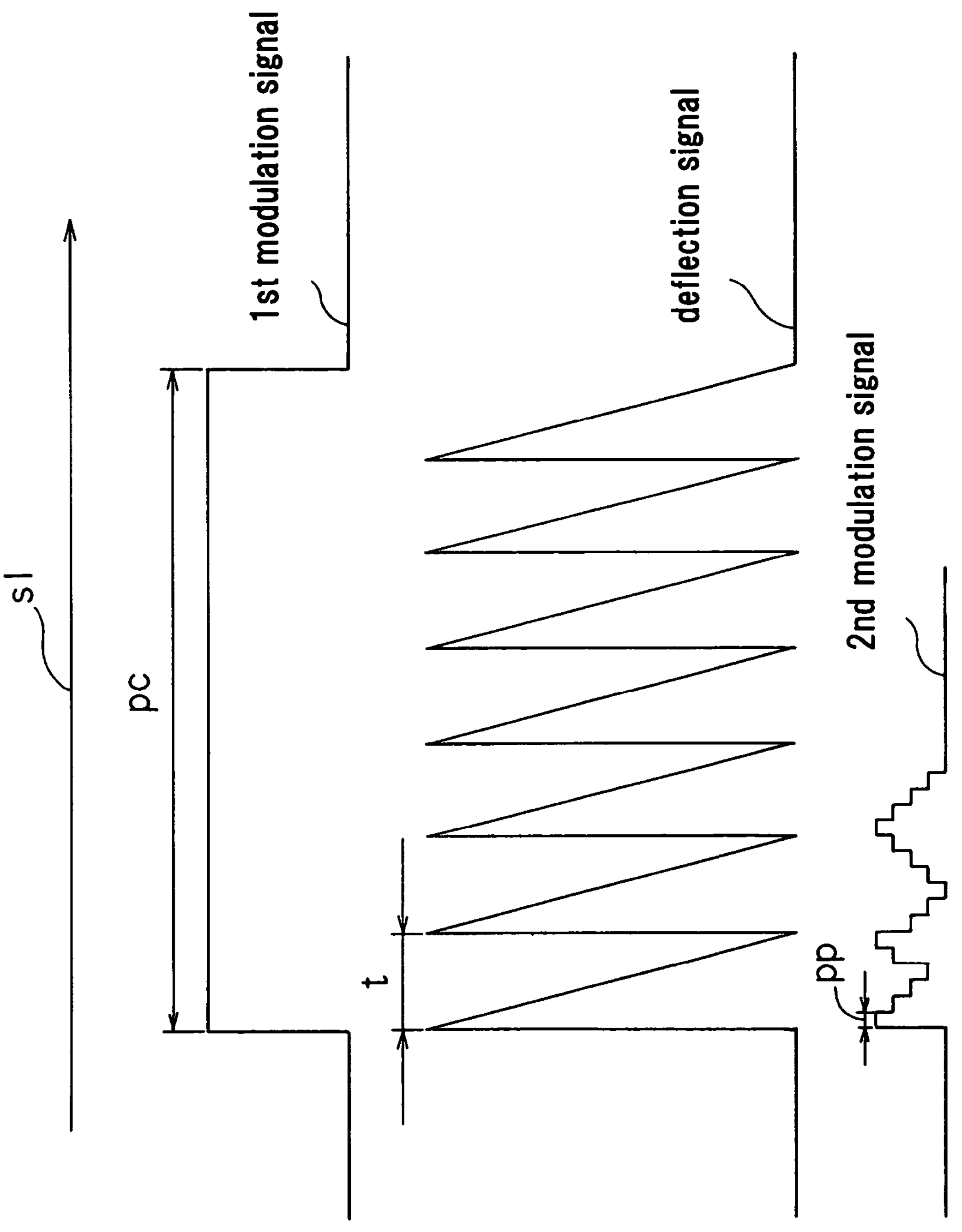
FIG. 6 is an explanatory view showing signals used for causing scanning action of the precision engraving beam and coarse engraving beam.

This aspect of construction will be described hereinafter. FIGS. 5 and 6 are explanatory views showing signals used for causing scanning action of the precision engraving beam L1 and coarse engraving beam L2. FIG. 6 is an enlarged view showing a portion of FIG. 5.

Arrow s1 in FIGS. 5 and 6 indicates the primary scanning direction. With rotation of the recording drum 11, the precision engraving beam L1 and coarse engraving beam L2 scan in the primary scanning direction s1 circumferentially of the recording drum 11. Arrows s2 in FIG. 5 indicate the secondary scanning direction. The precision engraving beam L1 is deflected by the AOD 23 to scan in the secondary scanning direction s2 axially of the recording drum 11. In these drawings, "pc" indicates the coarse engraving pixel pitch noted above, "pp" indicates the precision engraving pixel pitch, and "t" indicates cycles of the deflection by the AOD 23.

The deflection signal shown in these drawings is a signal used when the AOD 23 deflects the precision engraving beam L1. Thus, the deflection signal causes the precision engraving beam L1 to scan the flexo sensitive material 10 in the secondary scanning direction s2 at the precision engraving pixel pitch pp. The deflection signal has a frequency F1 that satisfies the following equation, where F2 is the modulation frequency of a first modulating signal:

$$F1=F2\cdot(pc/pp).$$

The first modulating signal shown in these drawings is a signal for causing the AOM 25 to modulate the coarse engraving beam L2 for the coarse engraving. The first modulating signal turns on/off and changes the intensity of the coarse engraving beam L2. Similarly, the second modulating signal is a signal for causing the AOM 22 to modulate the precision engraving beam L1. The second modulating signal turns on/off and changes the intensity of the precision engraving beam L1.

Where such construction is employed, the precision engraving beam L1, with rotation of the recording drum 11, performs engraving at the precision engraving pixel pitch pp during a scan in the primary scanning direction s1, and with the deflection by the AOD 23, performs engraving at the precision engraving pixel pitch pp during a scan in the secondary scanning direction s2 on the flexo sensitive material 10 within the coarse engraving pixel pitch pc. On the other hand, the coarse engraving beam L2, with rotation of the recording drum 11, performs engraving at the coarse engraving pixel pitch pc during a scan in the primary scanning direction s1.

Consequently, also with a construction for simultaneously causing the precision engraving beam L1 and coarse engraving beam L2 to scan axially of the recording drum 11 by moving the recording head 20, each of the precision engraving beam L1 and coarse engraving beam L2 can perform engraving at the required pixel pitch, thereby engraving a precise image at high speed.

Figure 7:
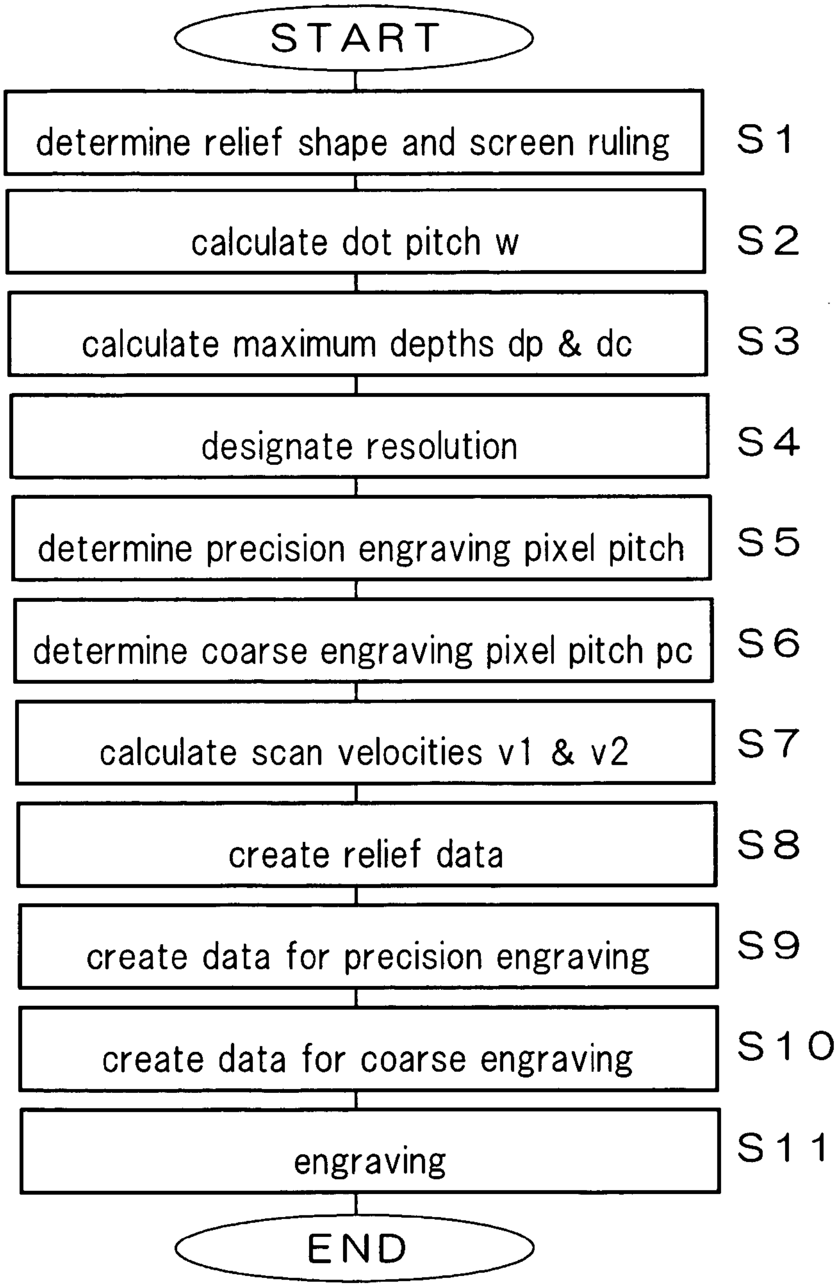
FIG. 7 is a flow chart of a platemaking process.

Next, a process of making a flexo printing plate by engraving the flexo sensitive material 10 with this laser engraving machine will be described. FIG. 7 is a flow chart showing the platemaking process.

For making a flexo printing plate, the operator first specifies a relief shape and a screen ruling (step S1). The relief shape and screen ruling are inputted from the personal computer 13 and transmitted to the controller 15.

Next, a dot pitch w is determined from the screen ruling specified (step S2). This dot pitch w is the inverse of the screen ruling.

Next, the maximum depth dp for the precision engraving and maximum depth dc for the coarse engraving are calculated (step S3). This operation is performed using equation (1) noted above.

Next, the operator specifies a resolution (step S4). This resolution is selected from 1200 dpi, 2400 dpi and 4000 dpi, for example.

Next, the precision engraving pixel pitch pp is determined from the resolution specified (step S5). The precision engraving beam L1 has a beam spot size adjusted so that the precision engraving pixel pitch pp and the width in the secondary scanning direction of the precision engraving beam L1 are substantially in agreement.

The coarse engraving pixel pitch pc also is determined (step S6). This coarse engraving pixel pitch pc corresponds to the dot pitch w noted hereinbefore.

Next, scan velocities for the engraving are determined (step S7).

When the precision engraving process and coarse engraving process are performed separately, a scan velocity may be determined for each engraving process based on the engraving sensitivity variable with the diameter of the laser beam, the pixel pitch for each engraving process, the engraving depth according to the shape of relief engraved in each engraving process, and given laser beam power.

In this embodiment, the precision engraving process and coarse engraving process are performed simultaneously, and the scans by the precision engraving beam L1 and the scan by the coarse engraving beam L2 are synchronized. Thus, in this embodiment, a laser beam power ratio is determined first for enabling a synchronized scan by these laser beams. Then, power of the precision engraving beam is determined from the laser beam power ratio, with the power of the coarse engraving beam serving as a given condition.

Next, a scan velocity ratio between the precision engraving and coarse engraving is determined for enabling the synchronized scan. Then, a scan velocity along the primary scanning direction s1 of the coarse engraving beam L2 is calculated from the power of the coarse engraving beam L2, the engraving sensitivity corresponding to the diameter of the coarse engraving beam L2, and a volume to be removed from the flexo sensitive material by the coarse engraving within a reference time.

A scan velocity v1 along the secondary scanning direction s2 of the precision engraving beam L1 is calculated by applying the scan velocity v2 along the primary scanning direction s1 of the coarse engraving beam L2 to the above-noted scan velocity ratio.

Figure 8:
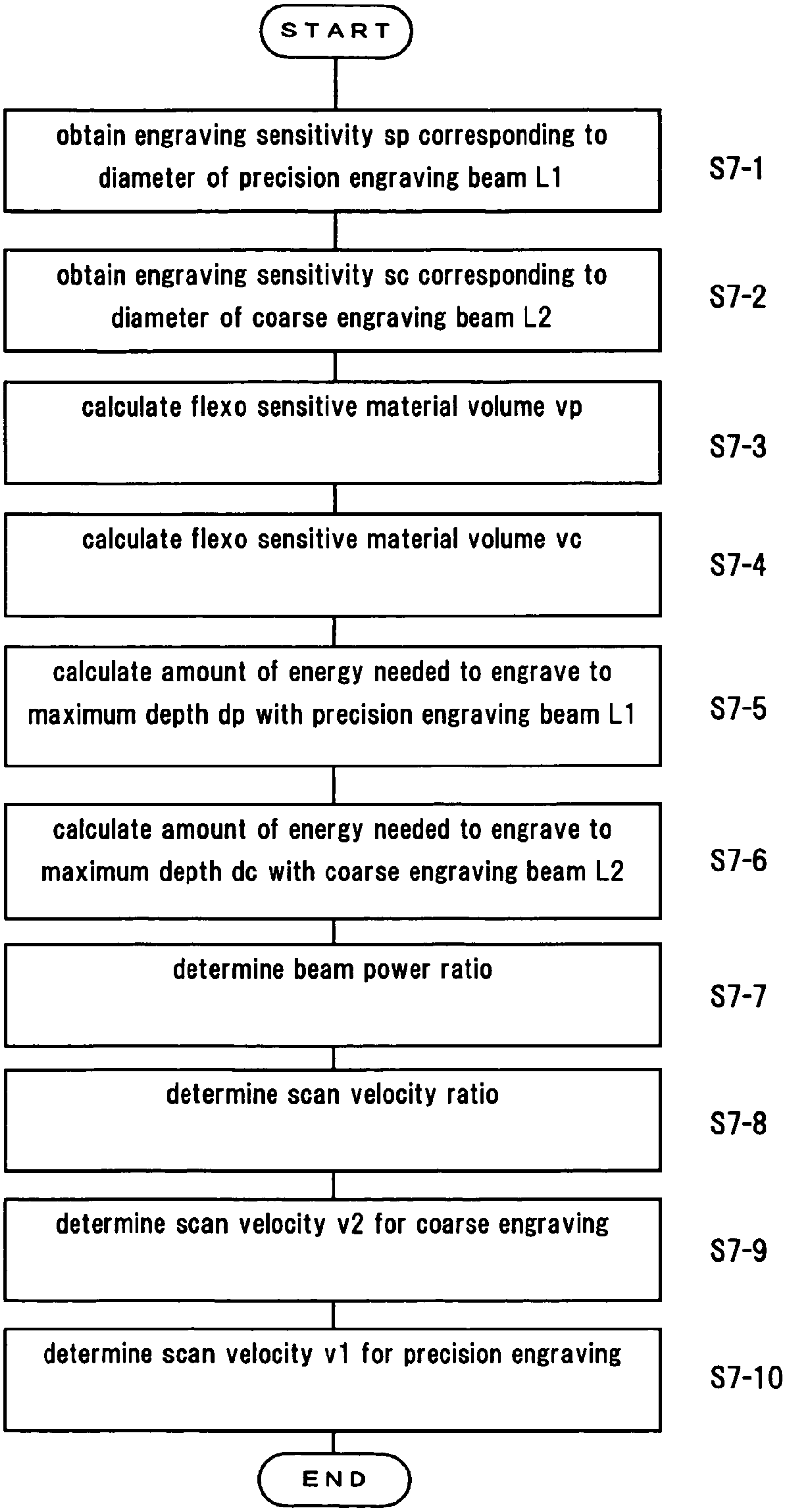
FIG. 8 is a flow chart of a subroutine executed in step S7.

The above operation will be described in greater detail with reference to the flow chart shown in FIG. 8. FIG. 8 is a flow chart showing details of steps included in step S7 of FIG. 7.

First, engraving sensitivity sp corresponding to the diameter of the precision engraving beam L1 is calculated (step S 7-1). Engraving sensitivity sp is a value resulting from the division of energy E of the laser beam by a volume V to be engraved by the laser beam. The energy E of the laser beam is a value resulting from the multiplication of the power of the laser source 21 by irradiation time. The engraving sensitivity in time of engraving the flexo sensitive material 10 is variable with the beam diameter. Thus, a table of degrees of engraving sensitivity matched against different diameters of the laser beam, or a formula for deriving degrees of engraving sensitivity from diameters of the laser beam, is prepared beforehand by experiment. Engraving sensitivity sp is obtained by applying a diameter of the precision engraving beam L1 to this table or formula.

Engraving sensitivity sc corresponding to a diameter of the coarse engraving beam L2 is obtained similarly (step S7-2).

Figure 9:
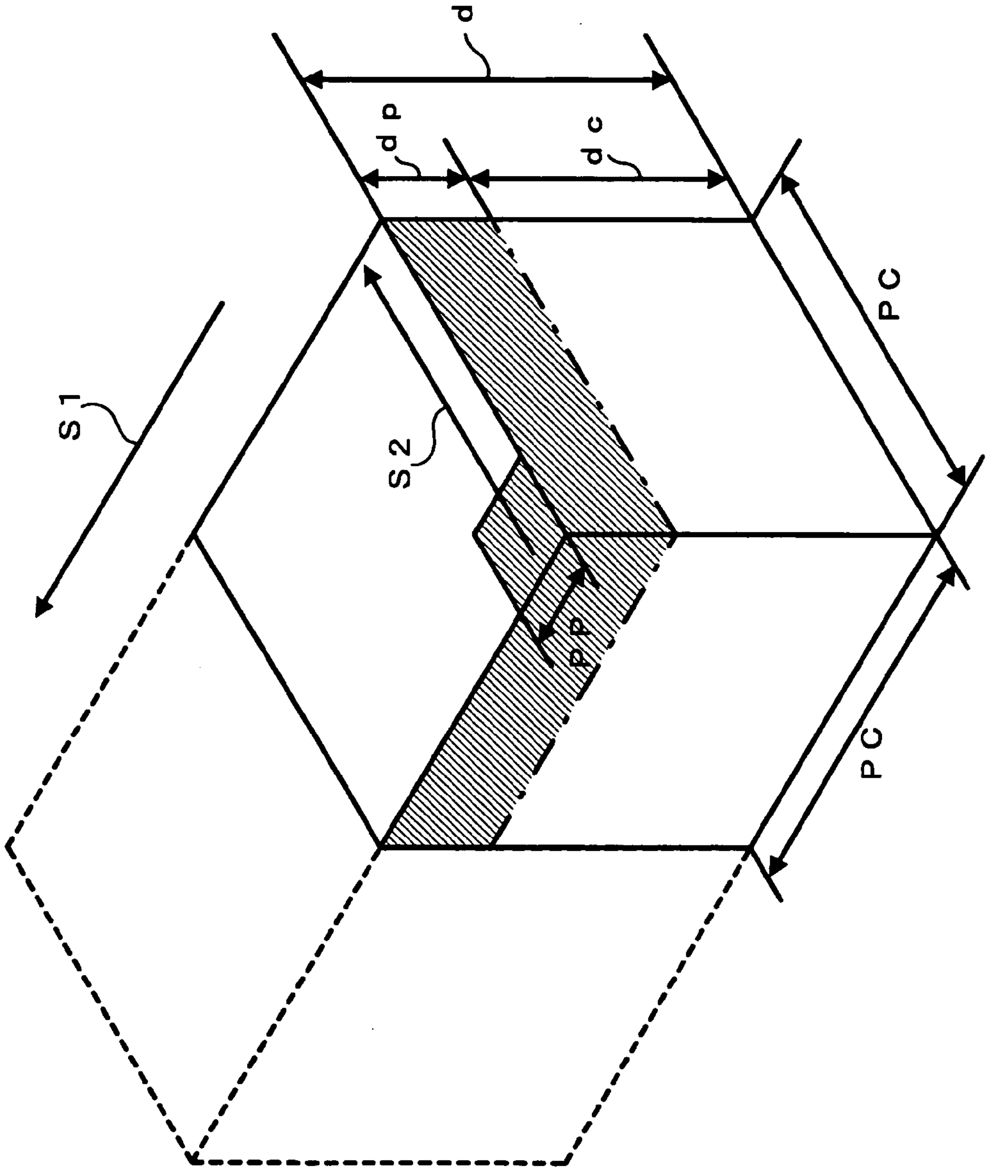
FIG. 9 is a perspective view schematically showing an engraving state.

Next, a flexo sensitive material volume vp to be engraved when engraving a rectangular area, which is the square of the coarse engraving pixel pitch pc, to the maximum depth dp of the precision engraving, is calculated (step S7-3). The rectangular area, or the square of the coarse engraving pixel pitch pc, is used as a reference area for determining a laser beam power ratio and a scan velocity ratio. FIG. 9 is a perspective view schematically showing an engraving state. As seen from FIG. 9, the flexo sensitive material volume vp engraved by the precision engraving beam L1 is pc*pc*dp.

Similarly, a flexo sensitive material volume vc to be engraved when engraving a rectangular area, which is the square of the coarse engraving pixel pitch pc, to the maximum depth dc of the coarse engraving, is calculated (step S7-4). The flexo sensitive material volume vc is pc*pc*(d−dp).

Next, an amount of energy needed to engrave, with the precision engraving beam L1, the flexo sensitive material 10 corresponding to the flexo sensitive material volume vp obtained in step S7-3 is calculated (step S7-5). This is equal to a value resulting from the multiplication of the flexo sensitive material volume vp by the engraving sensitivity sp in time of precision engraving.

An amount of energy needed to engrave, with the coarse engraving beam L2, the flexo sensitive material 10 corresponding to the flexo sensitive material volume vc obtained in step S7-4 is calculated similarly (step S7-6). This is equal to a value resulting from the multiplication of the flexo sensitive material volume vc by the engraving sensitivity sc in time of coarse engraving.

The energy applied to an object by a laser beam is equal to a product of the power of the laser beam and the irradiation time of the laser beam. Thus, $$E1=PW1*t1 \tag{2}$$

$$E2=PW2*t2 \tag{3}$$

where, E1 is an amount of energy of the precision engraving beam L1, E2 is an amount of energy of the coarse engraving beam 12, PW1 is the power of the precision engraving beam L1, PW2 is the power of the coarse engraving beam L2, t1 is a time taken to scan the reference area, and t2 is a time taken to scan the reference area.

In this embodiment, the precision engraving and coarse engraving are performed synchronously. Thus, the time t1 taken for the precision engraving beam L1 to scan the reference area is equal to the time t2 taken for the coarse engraving beam L2 to scan the reference area.

Consequently, equation (2) and equation (3) can be rewritten as the following equation (4):

$$E1/PW1=E2/PW2=t1=t2 \tag{4}$$

When the reference area is a rectangular area which is the square of the coarse engraving pixel pitch pc, E1=vp*sp and E2=vc*sc. Equation (4) can further be rewritten as equation (5):

$$vp*sp/PW1=vc*sc/PW2 \tag{5}$$

The sum of the power PW1 of the precision engraving beam L1 and the power PW2 of the coarse engraving beam L2 is considered overall laser power pw.

From the above, the power PW1 of the precision engraving beam L1 is expressed by equation (6) below.

$$PW1=pw*vp*sp/(vp*sp+vc*sc) \tag{6}$$

The power PW2 of the coarse engraving beam L2 is expressed by equation (7).

$$PW2=pw*vc*sc/(vp*sp+vc*sc) \tag{7}$$

When the maximum depth dp in time of precision engraving is derived from equation (1), equation (6) may be converted into the following equation (8). In equations (8) and (9) below, (2d·α+4 and pc·α+d·pc·β) is represented by A.

$$PW1=\frac{\{pc\cdot pw\cdot[4\cdot dt\cdot\alpha+4\cdot pp\cdot\alpha+2\cdot dt\cdot\beta+\left(\sqrt{2}\cdot pd-2\cdot wt\right)\cdot(2\cdot\alpha+pp\cdot\beta)\cdot\mathrm{Tan}\left(\frac{\pi\cdot\theta}{180}\right)]\}\ldots}{\{2\cdot[2\cdot dt\cdot(pc-pp)\cdot\alpha+pp\cdot A+(pc-pp)\cdot\left(\sqrt{2}\cdot pd-2\cdot wt\right)\cdot\alpha\cdot\mathrm{Tan}\left(\frac{\pi\cdot\theta}{180}\right)]\}} \tag{8}$$

Similarly, equation (7) may be converted into the following equation (9):

$$PW2=-\left\langle\frac{\{pc\cdot pw\cdot[4\cdot dt\cdot\alpha+4\cdot pp\cdot\alpha+2\cdot dt\cdot\beta+\left(\sqrt{2}\cdot pd-2\cdot wt\right)\cdot(2\cdot\alpha+pp\cdot\beta)\cdot\mathrm{Tan}\left(\frac{\pi\cdot\theta}{180}\right)]\}}{\{2\cdot[2\cdot dt\cdot(pc-pp)\cdot\alpha+pp\cdot A+(pc-pp)\cdot\left(\sqrt{2}\cdot pd-2\cdot wt\right)\cdot\alpha\cdot\mathrm{Tan}\left(\frac{\pi\cdot\theta}{180}\right)]\}}\right\rangle \tag{9}$$

The above operations determine PW1 and PW2.

Next, a ratio between the scan velocity v2 along the primary scanning direction S1 of the coarse engraving beam L2 and the scan velocity v1 along the secondary scanning direction S2 of the precision engraving beam L1 is determined (step S7-8).

Figure 10:
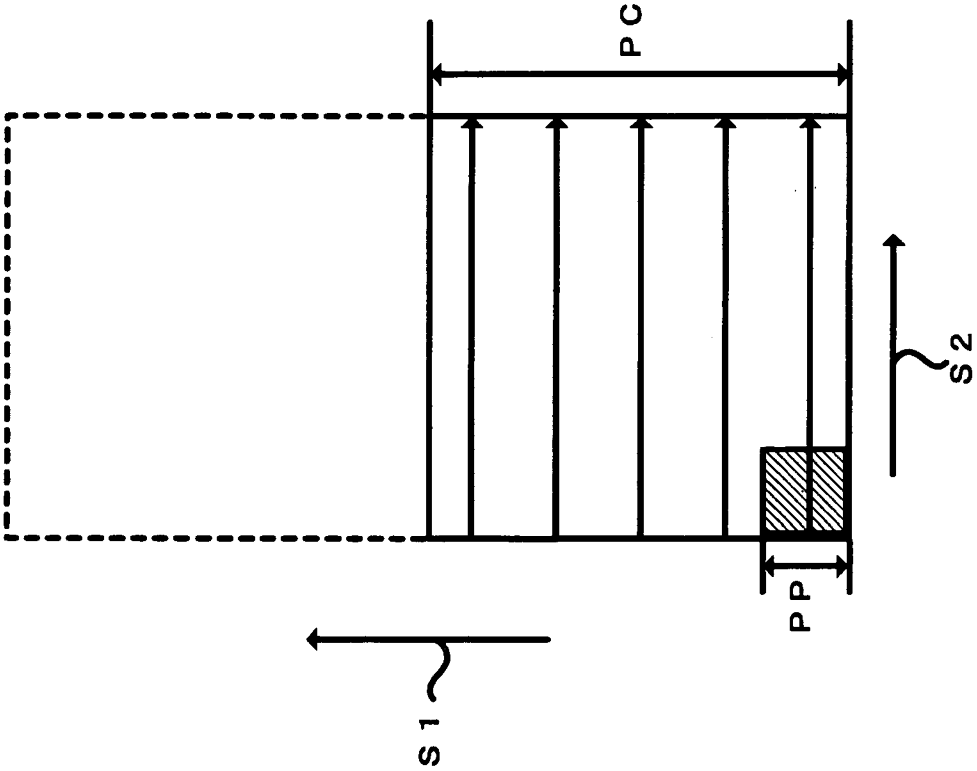
FIG. 10 is an explanatory view schematically showing an engraving state.

Consider the time t1 taken for the precision engraving beam L1 to scan the rectangular area or the square of the coarse engraving pixel pitch pc serving as the reference area (see FIG. 10). The precision engraving beam L1 needs to cover scan lines of length pc during the time t1 (pc/pp). Thus, the time t1 can be expressed by the following equation (10):

$$t1=(pc*pc/pp)/v1 \tag{10}$$

On the other hand, the time t2 taken for the coarse engraving beam L2 to scan the rectangular area or the square of the coarse engraving pixel pitch pc, serving as the reference area, is as follows:

$$t2=pc/v2 \tag{11}$$

The precision engraving and coarse engraving are performed synchronously, and thus t1=t2. Therefore, equation (10) and equation (11) are transformed as follows to determine the scan velocity ratio:

$$v1/v2=pc/pp \tag{12}$$

Next, the scan velocity v2 of the coarse engraving beam L2 is determined by substituting the power PW2 of the coarse engraving beam L2 into the following equation 13 (step S7-9):

$$v2=PW2/vc*sc \tag{13}$$

The scan velocity v1 of the precision engraving beam L1 is determined by applying to equation (12) the scan velocity v2 determined above (step S7-10).

Next, relief data showing a relief shape to be engraved is created from image data to be formed on the flexo sensitive material 10 (step S8). Image data serving as the basis is transmitted on-line or off-line to the controller 15 through the personal computer 13. Relief data is created based on this image data. This relief data is data on which data of each relief is superimposed. Priority is given to data of smaller depth for mutually overlapping areas.

Figure 11:
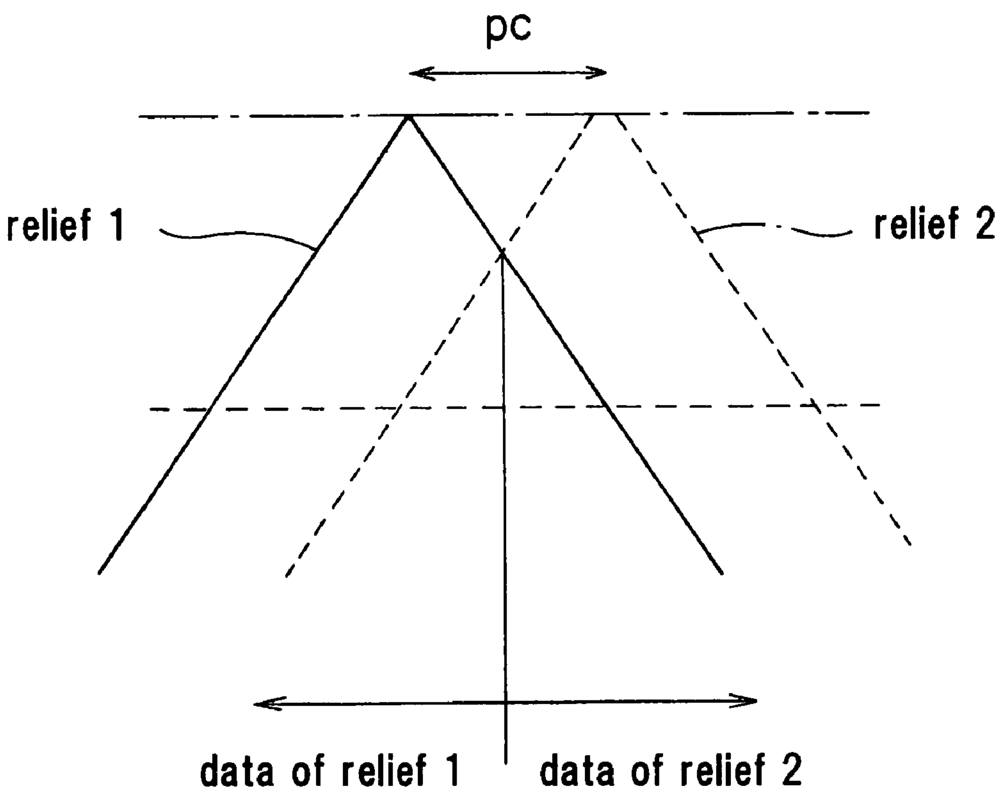
FIG. 11 is an explanatory view schematically showing a method of creating relief data.

FIG. 11 is an explanatory view schematically showing a method of creating the relief data.

This figure shows a state of relief 1 and relief 2 formed. Data of relief 1 is used for the area on the side of relief 1 from the point of contact between the inclined portions of relief 1 and relief 2, and data of relief 2 is used for the area on the side of relief 2 from the point of contact.

Next, continuous tone data for the precision engraving is created from the relief data (step S9). This continuous tone data is data for engraving areas of zero dot percent to the maximum depth dp. The continuous tone data is created as data for forming inclined portions of reliefs in a stepped form as shown in FIG. 3C, in areas of dot percentage at 0% to 100%.

Next, continuous tone data for the coarse engraving is created from the relief data (step S10). This continuous tone data is data for engraving areas of zero dot percent to the engraving depth dc, taking the relief angle θ into consideration, thereby ultimately to engrave such areas to the relief depth d.

Then, engraving is performed (step S11). At this time, the controller 15 controls the AOD 23 according to the scan velocity v1, and controls the rotary motor 72 according to the scan velocity v2. At the same time, the controller 15 controls the AOMs 22 and 25 with frequencies corresponding to the scan velocities v1 and v2. The controller 70 also turns on the first laser source 21 to power corresponding to the beam power PW1, and the second laser source 24 to power corresponding to the beam power PW2. Further, the controller 70 moves the recording head 12 in the secondary scanning direction at a speed synchronized with the rotating speed of the recording drum 11. The controller 15 controls the AOD 23 for causing the precision engraving beam L1 to scan in the secondary scanning direction. The controller 70 controls the AOM driver circuits 66 and 62 to perform a required engraving.

With the laser engraving machine in this embodiment, as described above, the precision engraving beam L1 and coarse engraving beam L2 can perform engraving at the required pixel pitches, respectively, thereby engraving a precise image at high speed. It is also possible to reduce the cost of the apparatus by arranging the optic 26 to be shared by the two engraving beams L1 and L2.

Figure 12:
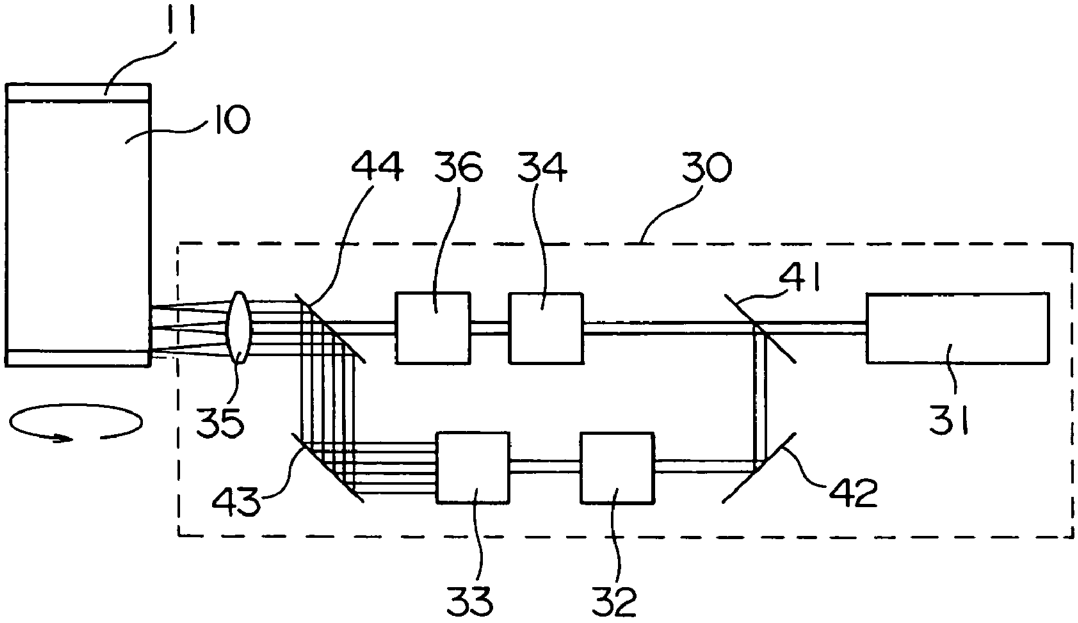
FIG. 12 is a schematic view of a laser engraving machine in a second embodiment of this invention.

Another embodiment of this invention will be described next. FIG. 12 is a schematic view of a laser engraving machine, which is a platemaking apparatus in a second embodiment of this invention.

This laser engraving machine has a recording head 30 constructed movable in a direction parallel to the axis of a recording drum 11.

The recording head 30 includes a single laser source 31, a beam splitter 41 for dividing a laser beam emitted from the laser source 31 into a first laser beam L1 and a second laser beam L2, an AOM 32 for modulating the first laser beam L1, an AOD 33 for causing the first laser beam L1 modulated by the AOM 32 to scan axially of the recording drum 11, an AOM 34 for modulating the second laser beam L2, a beam diameter changing device 36 for changing the diameter of the second laser beam L2 modulated by the AOM 34, a pair of deflecting mirrors 42 and 43, a synthesizing device 44 for synthesizing the first laser beam L1 deflected by the AOD 33 and the second laser beam L2 modulated by the AOD 34, and an optic 35 for condensing the first and second laser beams L1 and L2 synthesized by the synthesizing device 44 on a flexo sensitive material 10. The other aspects of the construction are the same as in the laser engraving machine in the first embodiment described hereinbefore.

This laser engraving machine also causes the precision engraving beam L1 and coarse engraving beam L2 to scan synchronously in the primary scanning direction, and causes the precision engraving beam L1 to scan in the secondary scanning direction. Each of the precision engraving beam L1 and coarse engraving beam L2 can perform engraving at a required pixel pitch, thereby engraving a precise image at high speed. It is also possible to reduce the cost of the apparatus by using the single laser source 31.

Figure 13:
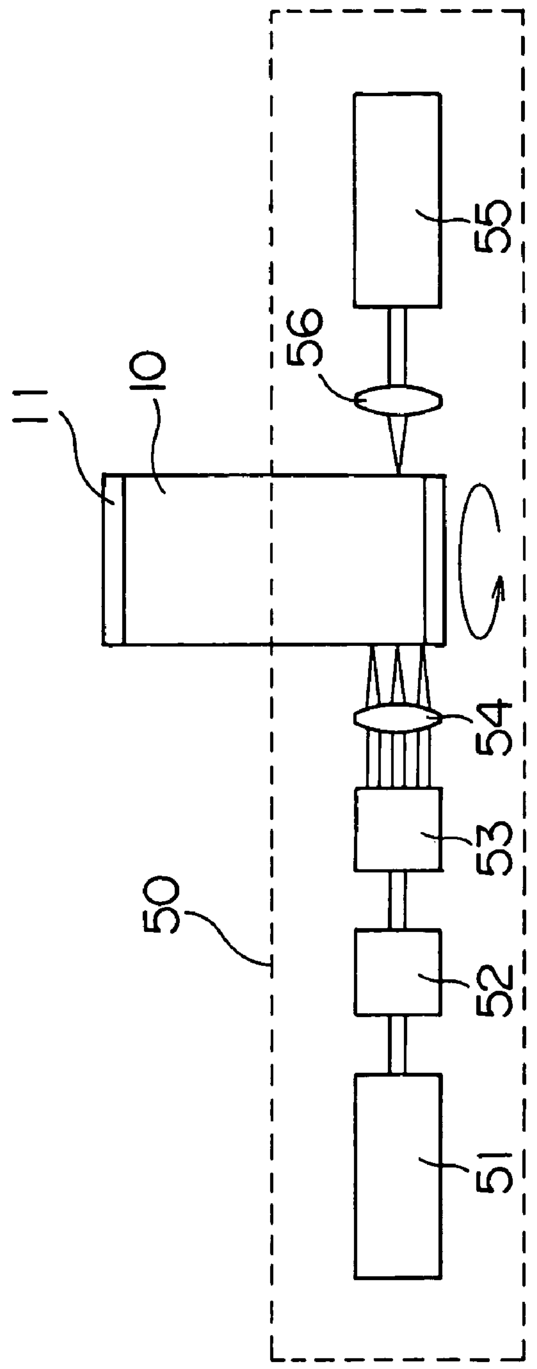
FIG. 13 is a schematic view of a laser engraving machine in a third embodiment of the invention.

A further embodiment of this invention will be described next. FIG. 13 is a schematic view of a laser engraving machine, which is a platemaking apparatus in a third embodiment of this invention.

This laser engraving machine has a recording head 50 constructed movable in a direction parallel to the axis of a recording drum 11.

The recording head 50 includes a first laser source 51 for emitting a first laser beam, an AOM 52 for modulating the first laser beam, an AOD 53 for causing the first laser beam modulated by the AOM 52 to scan axially of the recording drum 11, an optic 54 for condensing the first laser beam deflected by the AOD 53 on the flexo sensitive material 10, a second laser source 55 for emitting a second laser beam, and an optic 56 for condensing the second laser beam on the flexo sensitive materials 10.

In this embodiment, when engraving with the first laser beam, the flexo sensitive materials 10 may be preheated by keeping on the second laser beam. This can promote the engraving by the first laser beam.

In the laser engraving machine according to the third embodiment, the first laser beam is modulated by the AOM 52, but no AOM is used for the second laser beam. The second laser source 55 is controlled to emit the second laser beam as modulated.

Although an AOM, generally, is capable of high-speed modulation at about 1 MHz, germanium used in the AOM has a low transmittance for a laser beam, and about several percent of the laser beam is lost in the AOM. For this reason, the second laser source 55 itself is controlled to modulate the laser beam for the coarse engraving that does not require high-speed modulation. For the precision engraving, the laser beam continuously emitted from the first laser source 51 is modulated by the AOM 52. In this way. the laser beams can be used efficiently in time of coarse engraving. This applies also to the first embodiment described hereinbefore.

This laser engraving machine also causes the precision engraving beam L1 and coarse engraving beam L2 to scan synchronously in the primary scanning direction, and causes the precision engraving beam L1 to scan in the secondary scanning direction. Each of the precision engraving beam L1 and coarse engraving beam L2 can perform engraving at a required pixel pitch, thereby engraving a precise image at high speed. It is also possible to select suitable optics 54 and 56 according to the respective laser sources.

In the embodiments described above, each laser source is included in the recording head, Instead, the laser sources may be fixed to the main body of the apparatus, and the recording head may include reflecting mirrors or the like for acting on the laser beams emitted from the laser sources. This arrangement will allow the recording head to be compact.

The embodiments described above use as the recording material a flexo sensitive material which is one of the letterpress printing plates. However, this invention is applicable also where recesses are formed by laser engraving in an intaglio printing plate such as a photogravure printing plate.

This invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2005-063414 filed in the Japanese Patent Office on Mar. 8, 2005, the entire disclosure of which is incorporated herein by reference.

What is claimed is:

1. A platemaking apparatus for making a printing plate, comprising:

a rotatable recording drum for mounting a recording material peripherally thereof;

a first emitting device for emitting a first laser beam to irradiate the recording material at a first pixel pitch, said first beam having a first beam diameter on the recording material;

a second emitting device for emitting a second laser beam to irradiate the recording material at a second pixel pitch larger than said first pixel pitch, said second beam having a second beam diameter larger than said first beam diameter on the recording material;

a first scanning device for causing said first laser beam emitted from said first emitting device and said second laser beam emitted from said second emitting device to scan synchronously and axially of said recording drum;

a second scanning device for causing said first laser beam emitted from said first emitting device to scan the recording material at said second pixel pitch axially of said recording drum; and a controller configured to:

cause the first emitting device to engrave the recording material to a first depth, cause the second emitting device to engrave the recording material to a second depth larger than said first depth, control the platemaking apparatus so as to satisfy the equation $$F1=F2\cdot(pc/pp),$$

where F1 is a scanning frequency of the said first laser beam axially of said recording drum, F2 is a modulation frequency of said second modulating device, pp is said first pixel pitch, and pc is said second pixel pitch.

2. A platemaking apparatus for making a printing plate, comprising:

a rotatable recording drum for mounting a recording material peripherally thereof;

a first laser source for emitting a first laser beam to irradiate the recording material at a first pixel pitch, said first beam having a first beam diameter on the recording material;

a second laser source for emitting a second laser beam to irradiate the recording material at a second pixel pitch larger than said first pixel pitch, said second beam having a second beam diameter larger than said first beam diameter on the recording material;

a first modulating device for modulating said first laser beam;

a deflector for causing said first laser beam modulated by said first modulating device to scan the recording material axially of said recording drum;

a second modulating device for modulating said second laser beam emitted from said second laser source;

a synthesizing device for synthesizing said first laser beam deflected by said deflector and said second laser beam modulated by said second modulating device;

an optic for condensing the first and second laser beams synthesized by said synthesizing device on the recording material;

a scanning device for causing the first and second laser beams having passed through said optic and condensed on the recording material to scan synchronously and axially of said recording drum; and a controller configured to:

cause the first laser source to engrave the recording material to a first depth, cause the second laser source to engrave the recording material to a second depth larger than said first depth, cause the deflector to scan the recording material at said second pixel pitch axially of said recording drum, control the platemaking apparatus so as to satisfy the equation $$F1=F2\cdot(pc/pp),$$

where F1 is a scanning frequency of the said first laser beam axially of said recording drum, F2 is a modulation frequency of said second modulating device, pp is said first pixel pitch, and pc is said second pixel pitch.

3. A platemaking apparatus as defined in claim 2, wherein said first modulating device and said second modulating device are modulators.

4. A platemaking apparatus as defined in claim 2, wherein said first modulating device is a modulator, and said second modulating device is a device for controlling and causing said second laser source to emit said second laser beam as modulated.

5. A platemaking apparatus for making a printing plate, comprising:

a rotatable recording drum for mounting a recording material peripherally thereof;

a first laser source for emitting a first laser beam, said first laser beam having a first beam diameter on the recording material and irradiating the recording material at a first pixel pitch;

a second laser source for emitting a second laser beam, said second laser beam having a second beam diameter larger than said first beam diameter on the recording material, and irradiating the recording material at a second pixel pitch larger than said first pixel pitch;

a first modulating device for modulating said first laser beam;

a deflector for causing said first laser beam modulated by said first modulating device to scan axially of said recording drum;

a second modulating device for modulating said second laser beam;

a synthesizing device for synthesizing said first laser beam deflected by said deflector and said second laser beam modulated by said second modulating device;

an optic for condensing the first and second laser beams synthesized by said synthesizing device on the recording material;

a scanning device for causing the first and second laser beams having passed through said optic and condensed on the recording material to scan synchronously and axially of said recording drum; and a controller configured to:

cause the first emitting device to engrave the recording material to a first depth, cause the second emitting device to engrave the recording material to a second depth larger than said first depth, cause the deflector to cause said first laser beam to scan the recording material at said second pixel pitch axially of said recording drum, control the platemaking apparatus so as to satisfy the equation $$F1=F2\cdot(pc/pp),$$

where F1 is a scanning frequency of the said first laser beam axially of said recording drum, F2 is a modulation frequency of said second modulating device, pp is said first pixel pitch, and pc is said second pixel pitch.

6. A platemaking apparatus as defined in claim 5, wherein said first modulating device and said second modulating device are modulators.

7. A platemaking apparatus as defined in claim 5, wherein said first modulating device is a modulator, and said second modulating device is a device for controlling and causing said second laser source to emit said second laser beam as modulated.

* * * * *